United States Patent
Maida et al.

(10) Patent No.: US 7,923,394 B2
(45) Date of Patent: Apr. 12, 2011

(54) TITANIA-DOPED QUARTZ GLASS FOR NANOIMPRINT MOLDS

(75) Inventors: Shigeru Maida, Joetsu (JP); Hisatoshi Otsuka, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 284 days.

(21) Appl. No.: 12/132,922

(22) Filed: Jun. 4, 2008

(65) Prior Publication Data
US 2008/0305940 A1    Dec. 11, 2008

(30) Foreign Application Priority Data
Jun. 6, 2007    (JP) ................ 2007-150561

(51) Int. Cl.
C03C 3/06    (2006.01)
C03C 3/04    (2006.01)
C03C 3/076    (2006.01)

(52) U.S. Cl. ............... 501/54; 501/53; 501/55

(58) Field of Classification Search ........... 501/53, 501/54, 55, 56
See application file for complete search history.

(56) References Cited

U.S. PATENT DOCUMENTS

| | | | |
|---|---|---|---|
| 2003/0176269 A1* | 9/2003 | Arai et al. ............... | 501/54 |
| 2003/0226375 A1 | 12/2003 | Bernas et al. | |
| 2005/0245382 A1* | 11/2005 | Iwahashi et al. ........... | 501/54 |
| 2006/0276323 A1* | 12/2006 | Iwahashi et al. ........... | 501/54 |
| 2007/0042893 A1* | 2/2007 | Koike et al. ............. | 501/54 |

FOREIGN PATENT DOCUMENTS

| | | |
|---|---|---|
| JP | 2006-306674 A | 11/2006 |
| WO | 01/08163 A1 | 2/2001 |
| WO | 02/32622 A1 | 4/2002 |
| WO | 03/076352 A2 | 9/2003 |
| WO | 03/077038 A2 | 9/2003 |
| WO | 2004/08838 A1 | 10/2004 |
| WO | WO-2006/004169 A1 * | 1/2006 |
| WO | 2006/080241 A2 | 8/2006 |

OTHER PUBLICATIONS

European Search Report dated Nov. 4, 2008, issued in corresponding European Patent Application No. 08251958.8.
Database WPI Week 200701; Thompson Scientific, London, GB; AN 2007-004333; XP002501238 & JP 2006 306674 A (Shinetsu Sekiei KK) Nov. 9, 2006 abstract.

\* cited by examiner

*Primary Examiner* — Jerry Lorengo
*Assistant Examiner* — Noah S Wiese
(74) *Attorney, Agent, or Firm* — Westerman, Hattori, Daniels & Adrian, LLP

(57) ABSTRACT

In the nanoimprint lithography, titania-doped quartz glass having an internal transmittance distribution of up to 10% at wavelength 365 nm is suited for use as nanoimprint molds.

8 Claims, 1 Drawing Sheet

TITANIA-DOPED QUARTZ GLASS FOR NANOIMPRINT MOLDS

CROSS-REFERENCE TO RELATED APPLICATION

This non-provisional application claims priority under 35 U.S.C. §119(a) on Patent Application No. 2007-150561 filed in Japan on Jun. 6, 2007, the entire contents of which are hereby incorporated by reference.

TECHNICAL FIELD

This invention relates to a nanoimprint mold material having a minimized internal transmittance distribution and a low coefficient of thermal expansion.

BACKGROUND ART

As is well known, the semiconductor technology has made remarkable advances toward higher integration of integrated circuits. This tendency promoted to use a light source of shorter wavelength in the lithography process for semiconductor device manufacture. Photolithography using ArF excimer laser (193 nm) is the current main stream. A transition to photolithography using extreme ultraviolet (EUV) is expected to enable further integration. As the technology for the fabrication of semiconductor devices with a half-pitch of 32 nm or less, not only the photolithography, but also the nanoimprint lithography are considered promising.

The nanoimprint lithography is expected to find a wide variety of applications including optical waveguides, biochips, and optical storage media.

The nanoimprint lithography involves furnishing a mold (also referred to as stamp or template) having a fine pattern predefined thereon by electron beam lithography and etching techniques, coating a resin material on a substrate, and forcing the mold against the resin film for transferring the configuration of the fine pattern to the resin film. Specifically, semiconductor devices are fabricated by forcing a mold against a resist film coated on the surface of semiconductor wafer such as silicon for transferring the fine pattern.

The nanoimprint lithography is generally divided into photo nanoimprint lithography and thermal nanoimprint lithography. The photo nanoimprint lithography uses a photocurable resin as the resin material. While the mold is pressed against the resin, ultraviolet (UV) radiation is irradiated to the resin for curing, thereby transferring a fine pattern.

On the other hand, the thermal nanoimprint lithography uses a thermoplastic resin as the resin material. A fine pattern is transferred by pressing the mold against the thermoplastic resin which has been softened by heating above the glass transition temperature. Alternatively, a fine pattern is transferred by pressing the mold against a thermosetting resin while heating up to the curing temperature.

The properties required for nanoimprint molds include a mechanical strength to prevent failure of the mold during fine pattern transfer and a chemical stability to be inert to the resin.

The nanoimprint lithography is expected applicable to the fabrication of semiconductor devices with a half-pitch of 32 nm or less. However, the thermal nanoimprint lithography seems difficult to transfer a fine pattern at a high accuracy because the mold is heated by the same heat as applied for the softening or curing of the resin material so that the mold is deformed by thermal expansion.

It is thus believed that the photo nanoimprint lithography is selected when the nanoimprint lithography is applied to the fabrication of semiconductor devices with a half-pitch of 32 nm or less. In the photo nanoimprint lithography wherein UV radiation is transmitted by the mold, if the mold is UV absorptive, the mold temperature will vary. Also, the mold experiences temperature variations due to the heat of a light source or UV lamp, a temperature variation during nanoimprint process and other factors. In the transfer of fine patterns like semiconductor devices with a half-pitch of 32 nm or less, even a slight thermal expansion of the mold during the nanoimprint process can lead to a substantial decline of location accuracy. It would then be desirable to have a mold material that has a high transmittance and resistance to UV radiation and a low coefficient of thermal expansion.

JP-A 2006-306674 discloses to use as the mold material a low thermal expansion material having a high transmittance and resistance at the wavelength of a light source employed in the photo nanoimprint lithography.

The more precise transfer of a fine pattern, however, requires not only to use a low thermal expansion material having a high transmittance and resistance at the light source wavelength as the mold, but also to control the internal transmittance distribution of the mold at the light source wavelength. If an internal transmittance distribution exists within the mold, the resin can be cured to a varying extent upon light exposure, rendering the nanoimprint performance unstable.

DISCLOSURE OF THE INVENTION

An object of the invention is to provide a titania-doped quartz glass for use as nanoimprint molds, having a minimized internal transmittance distribution and low thermal expansion.

The inventors have found that a titania-doped quartz glass having an internal transmittance distribution of up to 10% with respect to UV radiation of 365 nm wavelength is suited as a mold for use in the photo nanoimprint lithography capable of transferring a fine pattern at a high location accuracy.

Specifically, the invention provides a titania-doped quartz glass for use as nanoimprint molds, having an internal transmittance distribution of up to 10% with respect to UV radiation of 365 nm wavelength.

In preferred embodiments, the titania-doped quartz glass meets at least one of the following parameters: an internal transmittance of at least 70% with respect to UV radiation of 365 nm wavelength; a titania content of 5 to 10% by weight; a titania concentration distribution of up to 3% by weight; a chlorine concentration of up to 500 ppm; an OH group concentration of up to 1000 ppm; a refractive index distribution of up to $5 \times 10^{-4}$; and a birefringence of up to 30 nm/cm. Also preferably, the titania-doped quartz glass is free of inclusions.

BENEFITS OF THE INVENTION

The titania-doped quartz glass has a least likelihood that the resin will be cured to a varying extent during fine pattern transfer operation due to a transmittance distribution of the mold. It is thus suited for use as nanoimprint molds.

DESCRIPTION OF THE PREFERRED EMBODIMENTS

Figure 1:
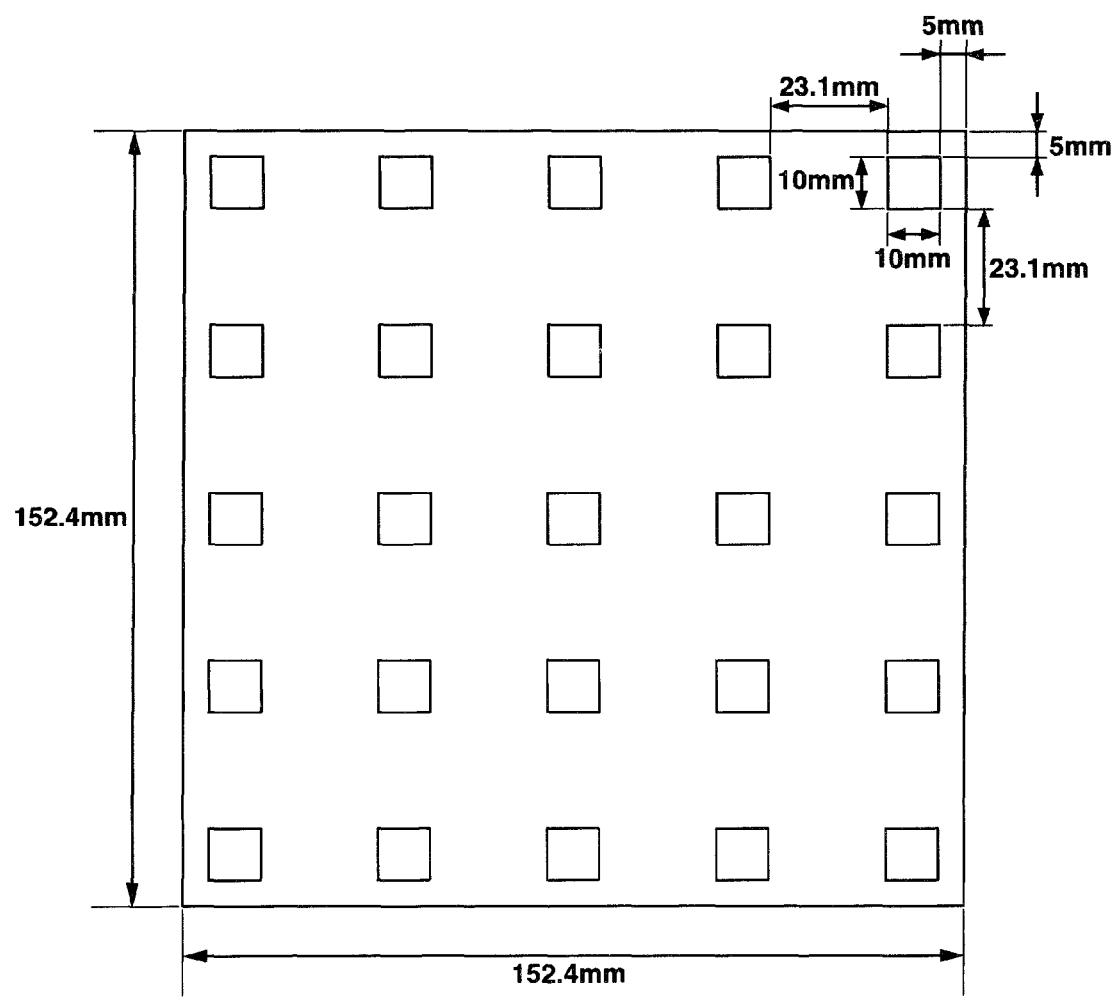
FIG. 1 is a plan view of a quartz glass substrate subject to optical analysis.

The titania-doped quartz glass in one embodiment of the invention has an internal transmittance distribution of up to 10%, preferably up to 5%, and more preferably up to 2% with respect to UV radiation of 365 nm wavelength. A controlled internal transmittance distribution within the range minimizes the likelihood of grading the cure of the resin, ensuring stable nanoimprinting. This quartz glass is thus best suited to form nanoimprint molds.

Use of a mold having a minimized internal transmittance distribution with respect to UV radiation of 365 nm wavelength minimizes the likelihood for the cured resin to have varying hardness, even when the mold has a low internal transmittance with respect to UV radiation of 365 nm wavelength. Where the mold has a low internal transmittance, however, more light absorption occurs within the mold so that the mold raises its temperature and thus suffers undesirable deformation due to thermal expansion, posing difficulties to the transfer of a fine pattern at a high location accuracy. Also a length of time taken until the resin is cured adversely affects the throughput.

In a preferred embodiment, the titania-doped quartz glass for use as nanoimprint molds has an internal transmittance of at least 70%, more preferably at least 80%, and even more preferably at least 90% with respect to UV radiation of 365 nm wavelength. As used herein, the "internal transmittance" refers to that of titania-doped quartz glass having a thickness of 10 mm and can be measured according to the standard of the Japan Optical Glass Industry Society, JOGIS-17-1982.

In another preferred embodiment, the titania-doped quartz glass has a titania concentration of 5% to 10% by weight, and more preferably 6% to 9% by weight. A titania concentration of 5% to 10% by weight ensures that the glass has a coefficient of linear thermal expansion (CTE) in the range of −50 to 50 ppb/° C., preferably −30 to 30 ppb/° C., more preferably −15 to 15 ppb/° C. between 10 and 50° C., preferably between 15° C. and 30° C., more preferably 20° C. and 25° C., enabling to minimize mold deformation by temperature changes even when the mold has a low internal transmittance. It is noted that the titania concentration in quartz glass can be measured by electron probe micro-analysis (EPMA).

In a further preferred embodiment, the titania concentration distribution within the mold is in the range of up to 3% by weight, more preferably up to 1.5% by weight, and even more preferably up to 0.5% by weight. A titania concentration distribution in excess of 3% by weight may allow the mold to undergo local thermal expansion. Then stable nanoimprint performance is not expectable in some cases. While the lower limit of titania concentration distribution is not particularly limited, the lower limit is ideally 0% by weight. The titania concentration distribution is generally at least 0.01% by weight because it is practically difficult to reduce the distribution to 0%.

If inclusions are present within the mold for photo nanoimprint lithography, they can interfere with proper nanoimprinting. This is because UV radiation for resin reaction will be absorbed or scattered by the inclusions. Then the titania-doped quartz glass of the invention should desirably be free of inclusions. As used herein, the term "inclusions" generally refers to foreign ingredients including bubbles, $TiO_2$ crystal phase, and $SiO_2$ crystal phase other than the titania-containing quartz glass phase.

In a further preferred embodiment, the titania-doped quartz glass has a chlorine concentration of up to 500 ppm, and more preferably up to 250 ppm. In the synthesis of titania-doped quartz glass, chlorine-containing compounds are often used as the source material. In this case, chlorine is left in the titania-doped quartz glass synthesized therefrom. Since chlorine has absorption near 325 nm, the presence of chlorine is problematic to the photo nanoimprint lithography using a light source of the near UV region such as a low-pressure mercury lamp as the light source for curing the resin against which the mold is being pressed. Once near UV light is absorbed in the mold by way of chlorine, it is converted to heat, causing a temperature increase to the mold. For this reason, the titania-doped quartz glass for mold use should desirably contain less chlorine. While the lower limit of chlorine concentration is not particularly limited, it is at or below the detection limit (10 ppm) of the standard analysis, x-ray fluorescence spectroscopy.

In a further preferred embodiment, the titania-doped quartz glass has an OH concentration of up to 1000 ppm, and more preferably up to 700 ppm. This is because the resin can be more readily separated from the mold as the OH concentration of quartz glass is reduced. While the lower limit of OH concentration is not particularly limited, it is generally at least 1 ppm, and preferably at least 5 ppm. It is noted that the OH concentration can be measured by an IR spectrophotometer. More particularly, an absorption coefficient at wave-number 4522 $cm^{-1}$ is measured by a Fourier transform IR spectrophotometer, from which the OH concentration is computed according to the equation:

$$\text{OH concentration (ppm)} = [(\text{absorption coefficient at } 4522 \text{ cm}^{-1})/T] \times 4400$$

wherein T is a thickness (cm) of a sample under test.

In a further preferred embodiment, the titania-doped quartz glass has a refractive index distribution at 25° C. with respect to He—Ne laser (632.8 nm) of up to $5 \times 10^{-4}$, more preferably up to $5 \times 10^{-5}$, and even more preferably up to $1 \times 10^{-5}$. A minimized refractive index distribution enables stable photo nanoimprinting. While the lower limit of refractive index distribution is not particularly limited, it is generally at least $1 \times 10^{-6}$. It is noted that the refractive index distribution can be measured by an interferometer Zygo Mark IV (Zygo Corp.).

In a further preferred embodiment, the titania-doped quartz glass has a birefringence at 25° C. of up to 30 nm/cm, more preferably up to 20 nm/cm, and even more preferably up to 10 nm/cm. Like the refractive index distribution, reducing the birefringence enables stable photo nanoimprinting. While the lower limit of birefringence is not particularly limited, it is generally at least 0.5 nm/cm, and preferably at least 1 nm/cm. It is noted that the birefringence can be measured by a birefringence meter ABR-10A (UNIOPT Co., Ltd.).

The method of preparing titania-doped quartz glass is not particularly limited as long as the resulting quartz glass meets the requirements mentioned above. Exemplary methods which can be used herein include the flame hydrolysis method capable of forming titania-doped quartz glass directly by subjecting source materials such as silicon tetrachloride or trichloromethylsilane and titanium tetrachloride to hydrolysis in an oxyhydrogen flame, the soot method (as typified by vapor-phase axial deposition (VAD) method) including preparing a titania-doped porous silica body through hydrolysis of source materials in an oxyhydrogen flame, followed by vitrification, and the plasma torch method (or Verneuil's method) including oxidizing source material gases through a plasma torch.

Preferably titania-doped quartz glass or porous silica mother material is prepared in an oxyhydrogen flame having a molar ratio of hydrogen to oxygen of up to 3.0/1, more preferably up to 2.5/1, and even more preferably up to 2.0/1, in order that titania-doped quartz glass have an internal transmittance of at least 70%.

The titania-doped quartz glass thus prepared is then heat treated in air or an oxygen atmosphere at 1,000° C. or above for a long period of time to further increase the internal transmittance and/or to reduce the internal transmittance distribution of titania-doped quartz glass.

To control the internal transmittance distribution, titania concentration distribution, refractive index distribution, and birefringence of titania-doped quartz glass, a source gas for $SiO_2$ and a source gas for $TiO_2$ may be mixed together and injected through a common burner nozzle. It is preferred to select a material which is non-reactive with the $SiO_2$ and $TiO_2$ source gases. Where titania-doped quartz glass is prepared by injecting the source gases through separate burner nozzles, it is difficult to reduce the internal transmittance distribution, titania concentration distribution, refractive index distribution, and birefringence thereof.

Birefringence can also be reduced by allowing the titania-doped quartz glass to slowly cool down from 1200° C. to 800° C. This slow cooling may also be performed at the same time when titania-doped quartz glass is shaped into the desired shape. Another possibility is a slow cooling in air or oxygen atmosphere at the same time as the heat treatment for increasing internal transmittance.

To prevent inclusions from being introduced into titania-doped quartz glass, the burner nozzle is designed to inject the source gases at a linear velocity of at least 50 m/sec. Particularly when the source used is titanium tetrachloride, it is so reactive that titania is likely to deposit on the tip of the burner nozzle if the linear velocity is less than 50 m/sec. If the titania deposit is scattered, such fragments can cause inclusions.

From the standpoint of reducing the chlorine concentration in titania-doped quartz glass, it is advantageous to use a chlorine-free compound as the source material. Where a chlorine-containing source material is used on account of material cost, physical properties and the like, it is recommended to use a compound having a low chlorine content. Since the $SiO_2$ source material is used in a larger amount on molar basis than the $TiO_2$ source material, use of a compound having a low chlorine content as the $SiO_2$ source material is effective for reducing the chlorine concentration in titania-doped quartz glass. Where a chlorine-containing compound is used as the source material, the preparation method should preferably avoid the plasma torch method. This is because the plasma torch method entails a higher chlorine content than the flame hydrolysis and soot methods.

For producing titania-doped quartz glass with a lower OH concentration, it is advantageous to employ the soot or plasma torch method. When titania-doped quartz glass is prepared by the flame hydrolysis process, it is recommended to limit the calorific value to 2500 kcal/hr or below at a source feed rate of 1 mol/hr with the proviso that the source materials used are compounds containing one silicon or titanium atom per molecule. If titania-doped quartz glass is prepared at a higher calorific value, the resulting glass would contain more OH groups.

EXAMPLE

Examples of the invention are given below by way of illustration and not by way of limitation.

Example 1

To a quartz burner were fed 35 m³/hr of hydrogen gas and 13 m³/hr of oxygen gas. The source materials, trichloromethylsilane and titanium tetrachloride were heated and gasified at a rate of 1000 g/hr and 100 g/hr, respectively, combined, and fed to the quartz burner. Hydrolytic reactions of trichloromethylsilane and titanium tetrachloride in oxyhydrogen flame produced $SiO_2$ and $TiO_2$, which were deposited on a target mounted at the quartz burner tip. The target was retracted at 10 mm/hr while it was rotated at 50 rpm. There was obtained a titania-doped quartz glass boule having a diameter of 150 mm. In this process, the burner nozzle injected the source gases at a linear velocity of 79 m/sec and the hourly colorific value was 12940 kcal/mol.

The titania-doped quartz glass boule was placed in an electric furnace where it was heated at 1700° C. for 6 hours for hot working into a prism of 155 mm×155 mm. An ingot "A" having a length (or thickness) of 1000 mm was obtained.

From titania-doped quartz glass ingot "A," two plates of 12 mm thick were sliced. The plates were polished with an abrasive comprising cerium oxide in colloidal silica, obtaining primary polished substrates of 152.4 mm×152.4 mm square and 10 mm thick. Under a white light source of 200,000 lux, the interior of mirror polished titania-doped quartz glass was observed to find no inclusions. The refractive index distribution and maximum birefringence of ingot "A" are shown in Table 2. The polished surface was observed under an atomic force microscope (AFM), finding that the surface polished with cerium oxide in colloidal silica had a surface roughness Ra equal to or less than 0.2 nm.

Two primary polished substrates were measured for spectral transmittance (inclusive of reflection loss) at 25 zones uniformly distributed throughout the substrate as shown in FIG. 1. These two primary substrates were further machined and polished into secondary substrates of 152.4 mm×152.4 mm square and 3 mm thick. The polished surface of the secondary substrates had an equivalent surface roughness to the 10-mm thick substrates. The substrates were measured again for spectral transmittance (inclusive of reflection loss) at 25 zones as shown in FIG. 1. From the measurement results of total 50 zones, maximum and minimum values of internal transmittance are reported in Table 1 as well as an internal transmittance distribution given as the difference between maximum and minimum values. The secondary polished substrates of 3 mm thick were also measured for OH concentration and titania concentration at 25 zones as shown in FIG. 1. Maximum and minimum values of OH and titania concentrations at total 50 zones are reported in Table 2. The chlorine concentration at total 50 zones is also reported in Table 2.

Example 2

To a quartz burner were fed 32 m³/hr of hydrogen gas and 16 m³/hr of oxygen gas. The source materials, trichloromethylsilane and titanium tetrachloride were heated and gasified at a rate of 1000 g/hr and 100 g/hr, respectively, combined, and fed to the quartz burner. Hydrolytic reactions of trichloromethylsilane and titanium tetrachloride in oxyhydrogen flame produced $SiO_2$ and $TiO_2$, which were deposited on a target mounted at the quartz burner tip. The target was retracted at 10 mm/hr while it was rotated at 50 rpm. There was obtained a titania-doped quartz glass boule having a diameter of 150 mm. In this process, the burner nozzle injected the source gases at a linear velocity of 82 m/sec and the hourly colorific value was 11850 kcal/mol.

The titania-doped quartz glass boule was placed in an electric furnace where it was heated at 1700° C. for 6 hours for hot working into a prism of 155 mm×155 mm. An ingot "B" having a length (or thickness) of 1000 mm was obtained.

From titania-doped quartz glass ingot "B," two plates of 12 mm thick were sliced. The plates were held at 1200° C. for 20 hours in air, and slowly cooled down to 1000° C. at a rate of 5° C./hr. They were held at 1000° C. for 50 hours, and slowly cooled down to 800° C. at a rate of 50° C./hr. They were polished with an abrasive comprising cerium oxide in colloidal silica, obtaining primary polished substrates of 152.4 mm×152.4 mm square and 10 mm thick. Under a white light source of 200,000 lux, the interior of mirror polished titania-doped quartz glass was observed to find no inclusions. The refractive index distribution and maximum birefringence of ingot "B" are shown in Table 2. The polished surface was observed under an AFM, finding that the surface polished with cerium oxide in colloidal silica had a surface roughness Ra equal to or less than 0.2 nm.

Two primary polished substrates were measured for spectral transmittance (inclusive of reflection loss) at 25 zones as shown in FIG. 1. These two primary substrates were further machined and polished into secondary substrates of 152.4 mm×152.4 mm square and 3 mm thick. The polished surface of the secondary substrates had an equivalent surface roughness to the 10-mm thick substrates. The substrates were measured again for spectral transmittance (inclusive of reflection loss) at 25 zones as shown in FIG. 1. From the measurement results of total 50 zones, maximum and minimum values of internal transmittance are reported in Table 1 as well as an internal transmittance distribution given as the difference between maximum and minimum values. The secondary polished substrates of 3 mm thick were also measured for OH and titania concentrations at 25 zones as shown in FIG. 1. Maximum and minimum values of OH and titania concentrations at total 50 zones are reported in Table 2. The chlorine concentration at total 50 zones is also reported in Table 2.

The titania-doped quartz glass samples prepared in Examples 1 and 2 had a minimized internal transmittance distribution at wavelength 365 nm, indicating their utility as nanoimprint molds. In particular, the titania-doped quartz glass sample prepared in Example 2 had a very high internal transmittance as demonstrated by the maximum and minimum values of internal transmittance at wavelength 365 nm which are both equal to 99%.

Comparative Example 1

To a quartz burner were fed 36 $m^3$/hr of hydrogen gas and 13 $m^3$/hr of oxygen gas. The source materials, trichloromethylsilane and titanium tetrachloride were heated and gasified at a rate of 1000 g/hr and 100 g/hr, respectively, and fed to separate nozzles of the quartz burner. Hydrolytic reactions of trichloromethylsilane and titanium tetrachloride in oxyhydrogen flame produced $SiO_2$ and $TiO_2$, which were deposited on a target mounted at the quartz burner tip. The target was retracted at 10 mm/hr while it was rotated at 50 rpm. There was obtained a titania-doped quartz glass boule having a diameter of 150 mm. In this process, the burner nozzle injected the source gases at a linear velocity of 80 m/sec and the hourly colorific value was 13310 kcal/mol.

The titania-doped quartz glass boule was placed in an electric furnace where it was heated at 1700° C. for 6 hours for hot working into a prism of 155 mm×155 mm. An ingot "C" having a length (or thickness) of 1000 mm was obtained.

From titania-doped quartz glass ingot "C," two plates of 12 mm thick were sliced. The plates were polished with an abrasive comprising cerium oxide in colloidal silica, obtaining primary polished substrates of 152.4 mm×152.4 mm square and 10 mm thick. Under a white light source of 200,000 lux, the interior of mirror polished titania-doped quartz glass was observed to find no inclusions. The refractive index distribution and maximum birefringence of ingot "C" are shown in Table 2. The polished surface was observed under an AFM, finding that the surface polished with cerium oxide in colloidal silica had a surface roughness Ra equal to or less than 0.2 nm.

Two primary polished substrates were measured for spectral transmittance (inclusive of reflection loss) at 25 zones as shown in FIG. 1. These two primary substrates were further machined and polished into secondary substrates of 152.4 mm×152.4 mm square and 3 mm thick. The polished surface of the secondary substrates had an equivalent surface roughness to the 10-mm thick substrates. The substrates were measured again for spectral transmittance (inclusive of reflection loss) at 25 zones as shown in FIG. 1. From the measurement results of total 50 zones, maximum and minimum values of internal transmittance are reported in Table 1 as well as an internal transmittance distribution given as the difference between maximum and minimum values. The secondary polished substrates of 3 mm thick were also measured for OH and titania concentrations at 25 zones as shown in FIG. 1. Maximum and minimum values of OH and titania concentrations at total 50 zones are reported in Table 2. The chlorine concentration at total 50 zones is also reported in Table 2.

Comparative Example 2

To a quartz burner were fed 33 $m^3$/hr of hydrogen gas and 14 $m^3$/hr of oxygen gas. The source materials, trichloromethylsilane and titanium tetrachloride were heated and gasified at a rate of 1000 g/hr and 100 g/hr, respectively, and fed to separate nozzles of the quartz burner. Hydrolytic reactions of trichloromethylsilane and titanium tetrachloride in oxyhydrogen flame produced $SiO_2$ and $TiO_2$, which were deposited on a target mounted at the quartz burner tip. The target was retracted at 10 mm/hr while it was rotated at 50 rpm. There was obtained a titania-doped quartz glass boule having a diameter of 150 mm. In this process, the burner nozzle injected the source gases at a linear velocity of 78 m/sec and the hourly colorific value was 12220 kcal/mol.

The titania-doped quartz glass boule was placed in an electric furnace where it was heated at 1700° C. for 6 hours for hot working into a prism of 155 mm×155 mm. An ingot "D" having a length (or thickness) of 1000 mm was obtained.

From opposite ends of titania-doped quartz glass ingot "D," two plates of 12 mm thick were sliced. The plates were held at 1000° C. for 5 hours in air. They were polished with an abrasive comprising cerium oxide in colloidal silica, obtaining primary polished substrates of 152.4 mm×152.4 mm square and 10 mm thick. Under a white light source of 200,000 lux, the interior of mirror polished titania-doped quartz glass was observed to find no inclusions. The refractive index distribution and maximum birefringence of ingot "D" are shown in Table 2. The polished surface was observed under an AFM, finding that the surface polished with cerium oxide in colloidal silica had a surface roughness Ra equal to or less than 0.2 nm.

Two primary polished substrates were measured for spectral transmittance (inclusive of reflection loss) at 25 zones as shown in FIG. 1. These two primary substrates were further machined and polished into secondary substrates of 152.4 mm×152.4 mm square and 3 mm thick. The polished surface of the secondary substrates had an equivalent surface roughness to the 10-mm thick substrates. The substrates were measured again for spectral transmittance (inclusive of reflection loss) at 25 zones as shown in FIG. 1. From the measurement results of total 50 zones, maximum and minimum values of internal transmittance are reported in Table 1 as well as an internal transmittance distribution given as the difference between maximum and minimum values. The secondary polished substrates of 3 mm thick were also measured for OH and titania concentrations at 25 zones as shown in FIG. 1. Maximum and minimum values of OH and titania concentrations at total 50 zones are reported in Table 2. The chlorine concentration at total 50 zones is also reported in Table 2.

The titania-doped quartz glass samples prepared in Comparative Examples 1 and 2 both had a noticeable internal transmittance distribution at wavelength 365 nm. In particular, the titania-doped quartz glass sample prepared in Comparative Example 1 was unacceptable as demonstrated by a very low minimum value of internal transmittance at wavelength 365 nm.

TABLE 1

| | Internal transmittance at wavelength 365 nm, % | | |
|---|---|---|---|
| | Max | Min | Distribution |
| Example 1 | 68 | 66 | 2 |
| Example 2 | 99 | 99 | 0 |
| Comparative Example 1 | 69 | 50 | 22 |
| Comparative Example 2 | 85 | 71 | 14 |

TABLE 2

| | Titania concentration, wt % | | Refractive index distribution, ×10$^{-5}$ @25° C. | Birefringence, nm/cm @25° C. | OH concentration, ppm | | Cl concentration, ppm |
|---|---|---|---|---|---|---|---|
| | Max | Min | | | Max | Min | |
| Example 1 | 7.4 | 7.3 | 2.2 | 28 | 882 | 861 | 75 |
| Example 2 | 7.4 | 7.3 | 0.8 | 6 | 878 | 863 | 72 |
| Comparative Example 1 | 10.2 | 4.6 | 8.2 | 32 | 902 | 856 | 73 |
| Comparative Example 2 | 10.5 | 4.2 | 6.4 | 25 | 895 | 852 | 74 |

Japanese Patent Application No. 2007-150561 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A titania-doped quartz glass for use as nanoimprint molds, having an internal transmittance of at least 80% with respect to UV radiation of 365 nm wavelength for a 10 mm thick layer of the glass, and having an internal transmittance distribution of up to 10% with respect to UV radiation of 365 nm wavelength;
wherein internal transmittance distribution is defined as the difference between maximum and minimum values of internal transmittance as measured in random areas of a 10 mm thick layer of the glass.

2. The titania-doped quartz glass of claim 1, containing 5 to 10% by weight of titania.

3. The titania-doped quartz glass of claim 1, having a titania concentration distribution of up to 3% by weight;
wherein titania concentration distribution is defined as the difference between maximum and minimum values of titania concentration by weight as measured in random areas of a 10 mm thick layer of the glass.

4. The titania-doped quartz glass of claim 1, which is free of inclusions.

5. The titania-doped quartz glass of claim 1, having a chlorine concentration of up to 500 ppm.

6. The titania-doped quartz glass of claim 1, having an OH concentration of up to 1000 ppm.

7. The titania-doped quartz glass of claim 1, having a refractive index distribution of up to 5×10$^{-4}$;
wherein refractive index distribution is defined as the difference between maximum and minimum values of refractive index as measured in random areas of a 10 mm thick layer of the glass.

8. The titania-doped quartz glass of claim 1, having a birefringence of up to 30 nm/cm.

* * * * *